United States Patent
Pannocchia et al.

(10) Patent No.: US 12,146,236 B2
(45) Date of Patent: Nov. 19, 2024

(54) USE OF QUARTZ PLATES DURING GROWTH OF SINGLE CRYSTAL SILICON INGOTS

(71) Applicant: GlobalWafers Co., Ltd., Hsinchu (TW)

(72) Inventors: Matteo Pannocchia, Lana (IT); Francesca Marchese, Merano (IT); Paolo Tosi, Merano (IT)

(73) Assignee: GlobalWafers Co., Ltd, Hsinchu (TW)

( * ) Notice: Subject to any disclaimer, the term of this patent is extended or adjusted under 35 U.S.C. 154(b) by 83 days.

(21) Appl. No.: 17/831,271

(22) Filed: Jun. 2, 2022

(65) Prior Publication Data

US 2022/0389609 A1    Dec. 8, 2022

Related U.S. Application Data

(60) Provisional application No. 63/197,726, filed on Jun. 7, 2021.

(51) Int. Cl.
  *C30B 15/14* (2006.01)
  *C30B 15/02* (2006.01)
  *C30B 15/10* (2006.01)
  *C30B 29/06* (2006.01)

(52) U.S. Cl.
  CPC .............. *C30B 15/14* (2013.01); *C30B 15/02* (2013.01); *C30B 15/10* (2013.01); *C30B 29/06* (2013.01)

(58) Field of Classification Search
  CPC ....... C30B 15/002; C30B 15/02; C30B 15/10; C30B 15/12; C30B 15/14; C30B 29/06
  See application file for complete search history.

(56) References Cited

U.S. PATENT DOCUMENTS

| | | | |
|---|---|---|---|
| 7,635,414 B2 | 11/2009 | Bender | |
| 2018/0291524 A1* | 10/2018 | Basak | C30B 15/04 |
| 2018/0320287 A1 | 11/2018 | Zepeda et al. | |
| 2020/0255971 A1 | 8/2020 | Kimbel | |
| 2022/0145491 A1 | 5/2022 | Phillips et al. | |
| 2022/0205129 A1 | 6/2022 | Pannocchia et al. | |
| 2022/0205130 A1 | 6/2022 | Zardoni et al. | |

FOREIGN PATENT DOCUMENTS

| | | | | |
|---|---|---|---|---|
| JP | S59141578 U | | 9/1984 | |
| JP | 61146788 A | * | 7/1986 | |
| KR | 2017081499 A | * | 7/2017 | C30B 15/00 |
| WO | 2018129141 A1 | | 7/2018 | |

* cited by examiner

*Primary Examiner* — Hua Qi
(74) *Attorney, Agent, or Firm* — Armstrong Teasdale LLP (57) ABSTRACT

Methods for producing single crystal silicon ingots by Continuous Czochralski (CCz) are disclosed. One or more plates are added to the outer melt zone of a crucible assembly such that the plates are disposed on the initial charge of solid-state silicon. The silicon is melted and the plates float on the silicon melt. When silicon is added to the outer melt zone to replenish the melt during ingot growth, the silicon contacts the plates rather than falling directly into the melt in the outer melt zone. The silicon melts and falls through openings that extend through the thickness of the plates.

8 Claims, 8 Drawing Sheets

FIG. 8

USE OF QUARTZ PLATES DURING GROWTH OF SINGLE CRYSTAL SILICON INGOTS

CROSS-REFERENCE TO RELATED APPLICATION

This application claims the benefit of U.S. Provisional Patent Application No. 63/197,726, filed Jun. 7, 2021, which is incorporated herein by reference in its entirety.

FIELD OF THE DISCLOSURE

The field of the disclosure relates to methods for producing single crystal silicon ingots by Continuous Czochralski (CCz) and, in particular, methods in which quartz plates are added to an outer melt zone of the crucible assembly.

BACKGROUND

Continuous Czochralski (CCz) is well suited to form 300 mm or 200 mm diameter single crystal silicon ingots such as ingots that are relative heavily doped with arsenic or phosphorous. Continuous Czochralski methods involve forming a single crystal silicon ingot from a melt of silicon while continuously or intermittently adding solid-state silicon to the melt to replenish the melt while the ingot is grown. The methods may involve forming multiple ingots from the same melt while the hot zone remains at temperature (i.e., with a melt continuously being present in the crucible assembly while the plurality of ingots is grown).

Customers increasingly specify that wafers sliced from ingots grown by continuous Czochralski methods have a low void count (e.g., less than 30 defects per wafer) for both 200 mm and 300 mm ingots. Continuous Czochralski methods may involve a crucible assembly that includes at least two and often three melt zones that are separated by physical barriers—an outer melt zone into which solid polycrystalline silicon is fed, a middle melt zone in which the melt stabilizes, and an inner melt zone from which the silicon ingot is pulled. Addition of solid polycrystalline silicon to the melt causes inert gas bubbles (e.g., argon bubbles) to form in the melt which impacts the void count.

In some conventional methods, buffer members such as quartz cullets have been added to the melt to reduce formation of inert gas bubbles. The quartz cullets cushion the polysilicon that falls into the melt. The cullets also promote dissipation of the inert gas bubbles. However, adding quartz cullets adds complexity to the crystal growth process. Cullets also dissolve relatively quickly. Gaps may form between groups of cullets which limits their effectiveness.

A need exists for alternative methods for forming silicon ingots which reduce the defect count in silicon wafers sliced from the ingot and/or in which inert gas bubble formation in the melt is reduced or which promote dissipation of the inert gas bubbles.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for growing a single crystal silicon ingot in a continuous Czochralski process. A charge of polycrystalline silicon is added to a crucible assembly. The crucible assembly includes a weir and a sidewall that define an outer melt zone between the weir and the sidewall. One or more plates is added to the outer melt zone. A melt of silicon is formed in the crucible assembly. A surface of the melt is contacted with a seed crystal. A single crystal silicon ingot is withdrawn from the melt. Solid polycrystalline silicon feedstock is added to the outer melt zone while withdrawing the single crystal silicon ingot to replenish the melt. The one or more plates at least partially cover the melt in the outer melt zone.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for growing a single crystal silicon ingot in a continuous Czochralski (CCz) process. One or more plates (e.g., quartz plates) are added to the outer melt zone of the crucible assembly prior to formation of the ingot. During ingot growth, solid-state silicon (e.g., polycrystalline silicon) is added to the outer melt zone. The polycrystalline silicon falls onto the plates. The solid polycrystalline silicon melts and falls through openings formed in the plates and enters the silicon melt.

Figure 6:
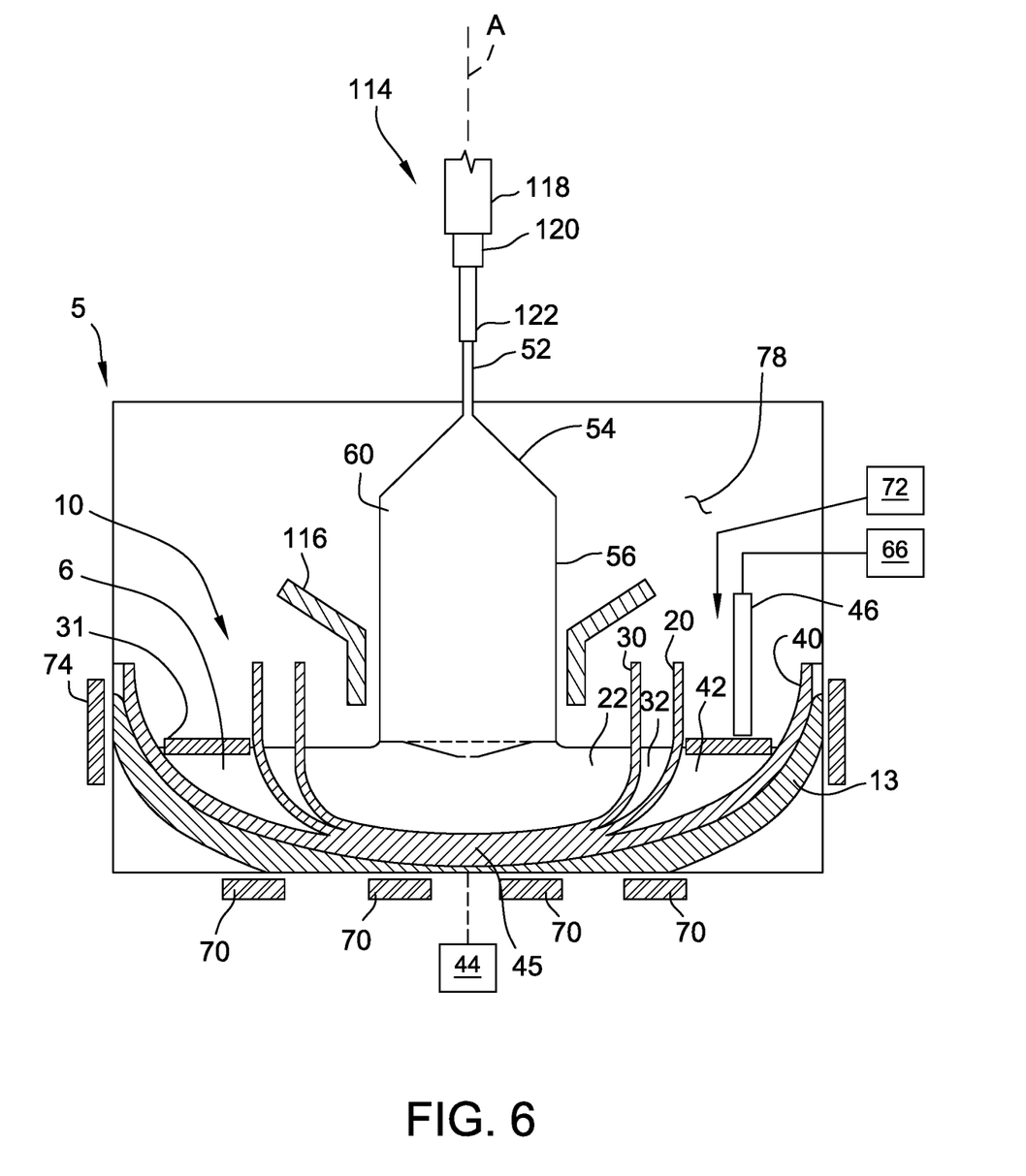
FIG. 6 is a cross-section view of the ingot puller apparatus showing a silicon ingot being pulled from the silicon melt.

An example ingot puller apparatus 5 for producing an ingot 60 by a continuous Czochralski process is shown in FIGS. 1-6. As shown in FIG. 6, the ingot puller apparatus 5 includes a crucible assembly 10 that contains a melt 6 of semiconductor or solar grade silicon material. A susceptor 13 supports the crucible assembly 10. The crucible assembly 10 has a sidewall 40 and one or more fluid barriers 20, 30 or "weirs" that separate the melt into different melt zones. In the illustrated embodiment, the crucible assembly 10 includes a first weir 20. The first weir 20 and sidewall 40 define an outer melt zone 42 of the silicon melt (and of the crucible assembly 10). The crucible assembly 10 includes a second weir 30 radially inward to the first weir 20 which defines an inner melt zone 22 of the silicon melt. The inner melt zone 22 is the growth region from which the single crystal silicon ingot 60 is grown. The first weir 20 and a second weir 30 define a middle melt zone 32 of the silicon melt in which the melt 6 may stabilize as it moves toward the inner melt zone 22. The first and second weirs 20, 30 each have at least one opening defined therein to permit molten silicon to flow radially inward towards the growth region of the inner melt zone 22.

In the illustrated embodiment, the first weir 20, second weir 30 and sidewall 40 each have a generally annular shape. The first weir 20, second weir 30 and sidewall 40 may be part of three nested crucibles which are joined at the bottom or floor 45 of the crucible assembly 10 (i.e., the first and second weirs 20, 30 are the sidewalls of two crucibles nested within a larger crucible). The crucible assembly configuration depicted in FIGS. 1-6 is exemplary. In other embodiments, the crucible assembly 10 has a single layer floor (i.e., does not have nested crucibles) with the weirs extending upward from the floor 45. Optionally, the floor 45 may be flat rather than curved and/or the weirs 20, 30 and/or sidewall 40 may be straight-sided. Further, while the illustrated crucible assembly 10 is shown with two weirs, in other embodiments the crucible assembly may have a single weir or even no weirs.

A feeding tube 46 feeds solid-state silicon which may be, for example, polysilicon chips, granular polysilicon, or chunk polysilicon, or a combination thereof, into the outer melt zone 42. Chuck polysilicon is generally larger in size than chip polysilicon which is larger in size than granular polysilicon. For example, chuck polysilicon may generally have an average nominal size of at least 15 mm (e.g., ranging from 5 mm to 110 mm) while chip polysilicon may have an average nominal size from 1 to 15 mm. The solid-state silicon is added at a rate sufficient to maintain a substantially constant melt elevation level and volume during growth of the ingot 60.

Figure 1:
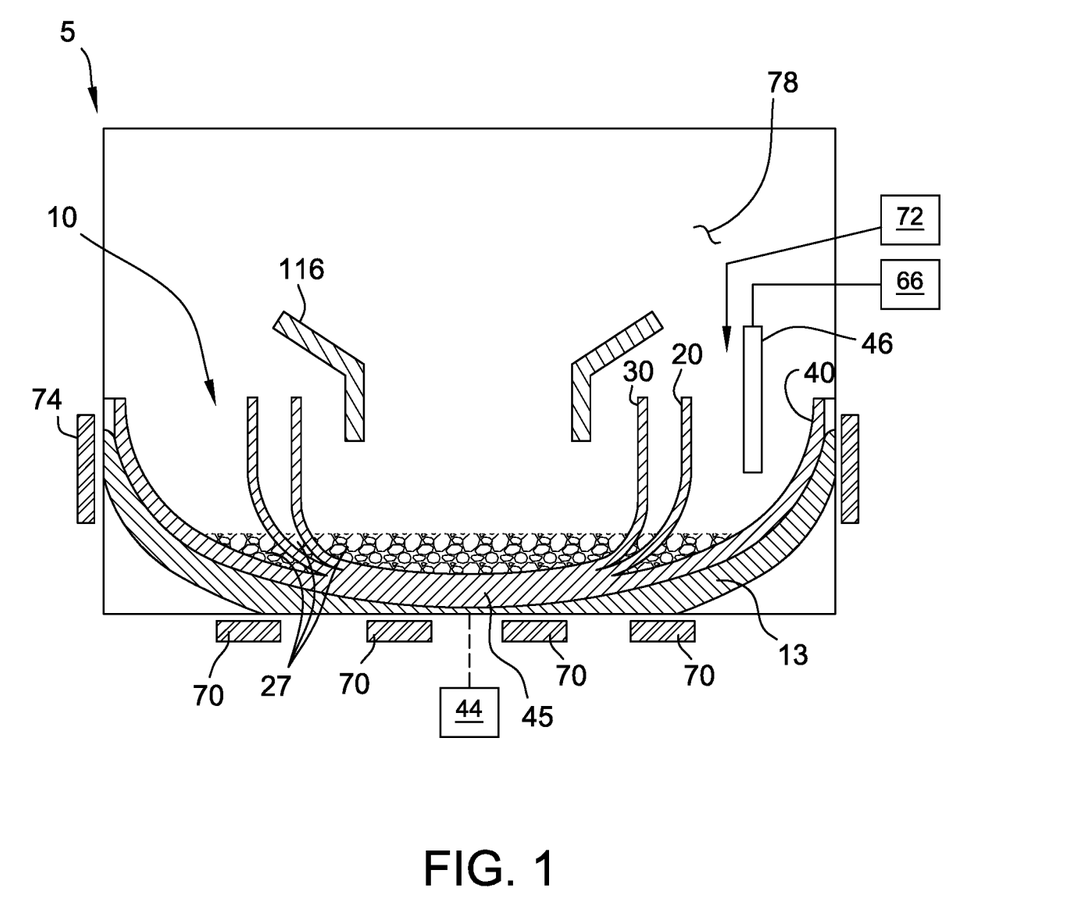
FIG. 1 is a cross-section view of an example ingot puller apparatus having a solid charge of silicon disposed therein.
Figure 2:
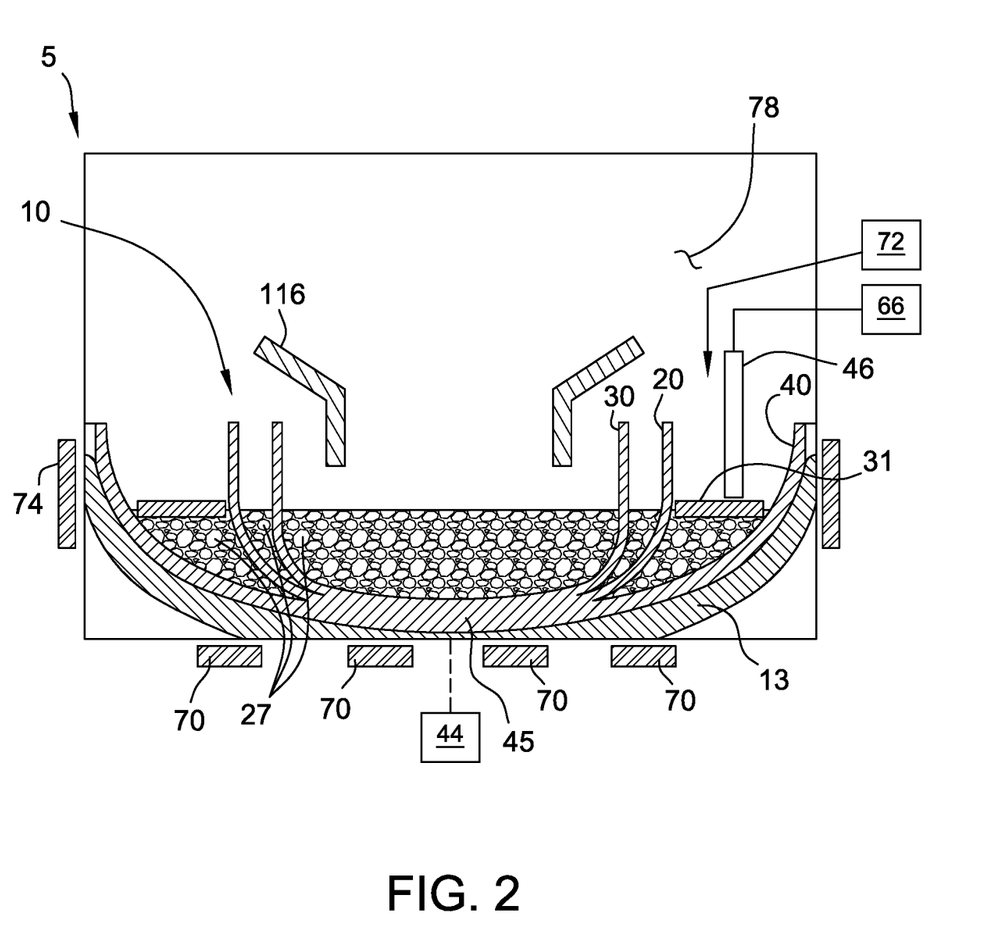
FIG. 2 is a cross-section view of the ingot puller apparatus after plates are positioned on the surface of the silicon charge.
Figure 3:
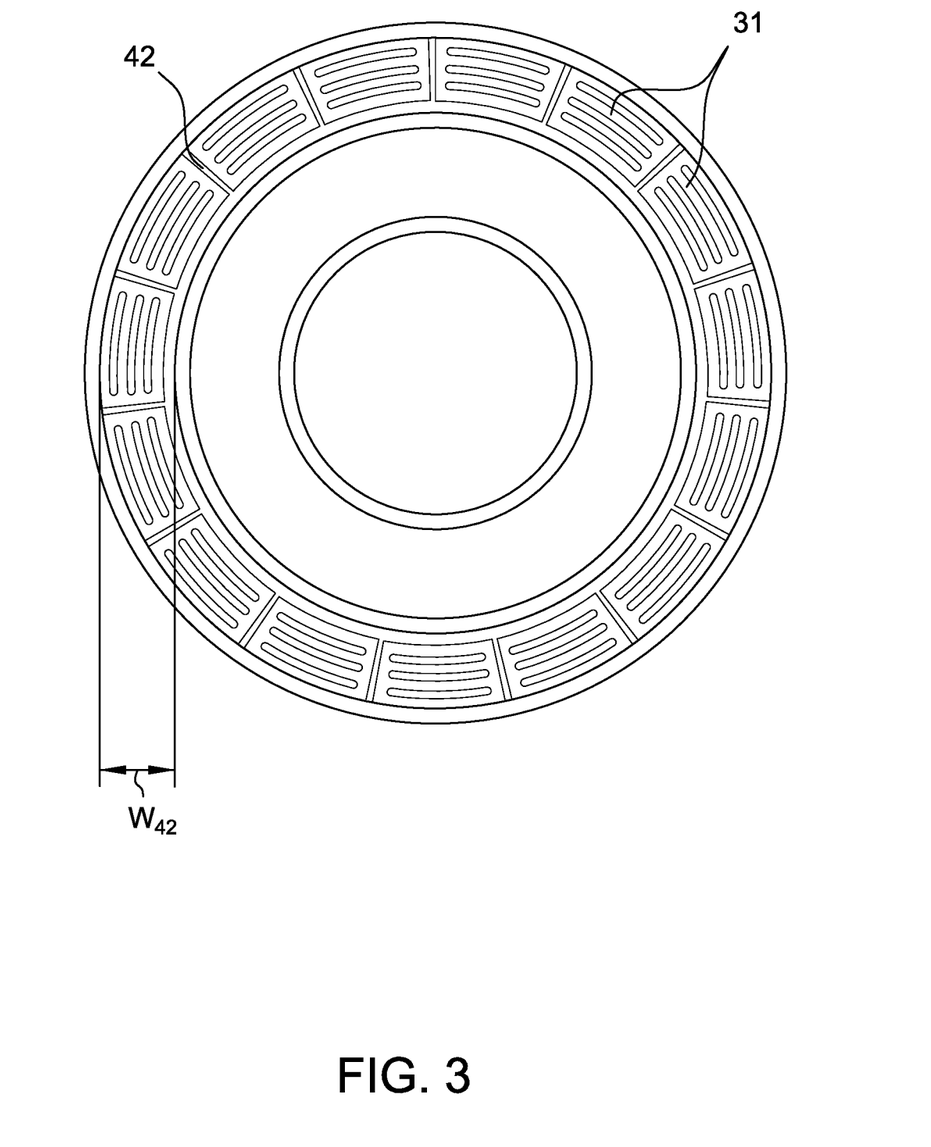
FIG. 3 is a top view of a crucible assembly of the ingot puller apparatus having plates disposed therein.

Generally, the melt 6 from which the ingot 60 is drawn is formed by loading polycrystalline silicon into a crucible to form an initial silicon charge 27 (FIG. 1). In general, an initial charge is between about 10 kilograms and about 200 kilograms of polycrystalline silicon, which may be chip, chunk, granular, or a combination thereof. The mass of the initial charges depends on the desired crystal diameter and hot zone design. Initial charge does not reflect the length of the ingot crystal, because polycrystalline silicon is continuously fed during crystal growth.

A variety of sources of polycrystalline silicon may be used including, for example, granular polycrystalline silicon produced by thermal decomposition of silane or a halosilane in a fluidized bed reactor or polycrystalline silicon produced in a Siemens reactor. While the solid-state silicon is typically polysilicon, an amount of single crystal silicon (e.g., portions discarded from a cropped ingot) may also be used.

Once polycrystalline silicon is added to the crucible assembly 10 to form a charge 27, one or more plates 31 (FIG. 2) are added to the charge 27 in the outer melt zone 42. In the illustrated embodiment, a plurality of plates 31 (FIG. 3) are added to the outer melt zone 42 (e.g., at least two, at least three, at least four, at least five, at least eight, at least ten or at least 12 plates or more) are added to the outer melt zone 42. In other embodiments, a single plate 31 is added (e.g., a plate that circumscribes the entire circumference of the outer melt zone 42).

In embodiments in which a plurality of plates 31 are added to the outer melt zone 42, the plates may be free-floating and not connected to each other. In other embodiments, the plates 31 may be connected. The plates 31 may be sized to minimize gaps between adjacent plates 31.

The plates 31 may be made of quartz or other material that allows the plates 31 to operate as described herein. The plates 31 are generally less dense than the melt 6 of silicon such that the plates float within the melt 6 after formation of the melt 6.

Figure 4:
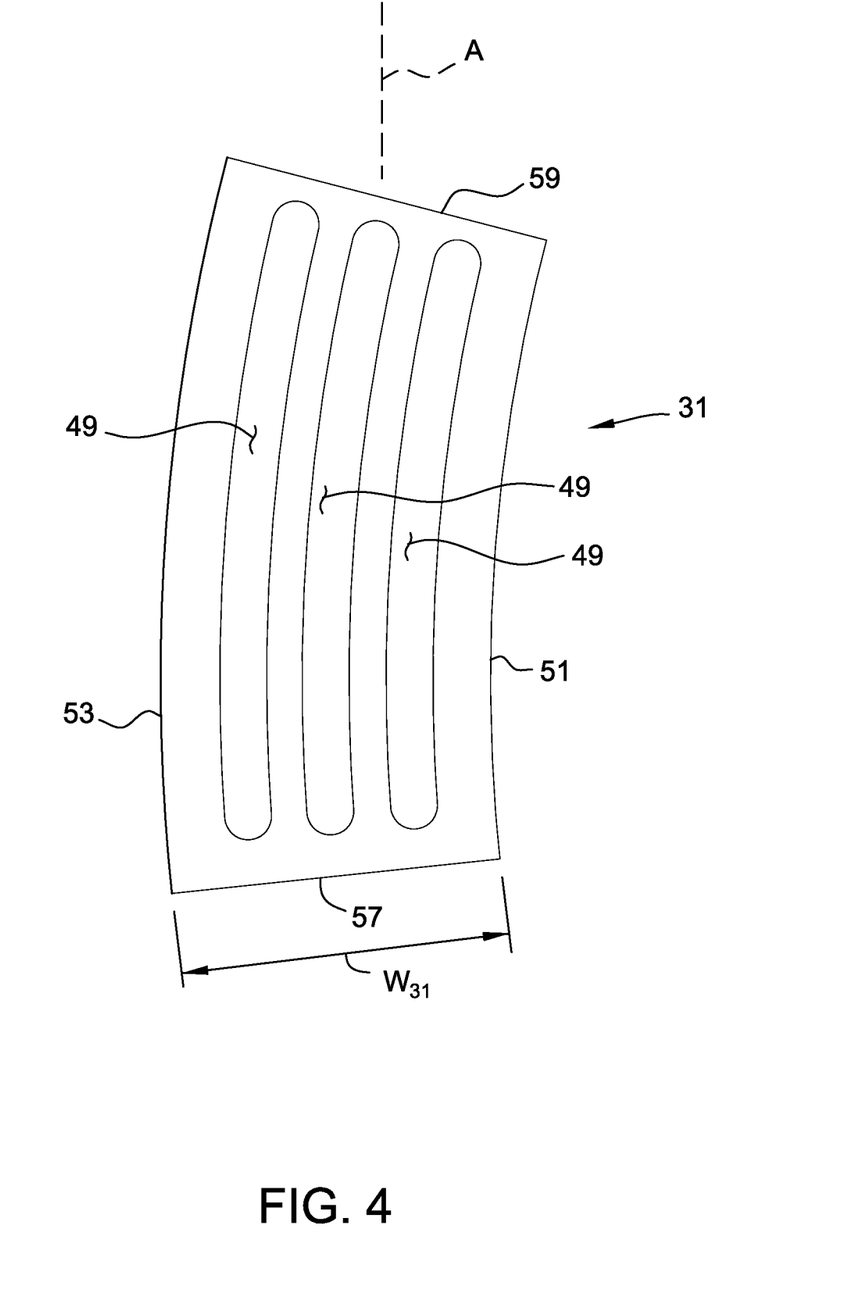
FIG. 4 is a top view of a plate.
Figure 5:
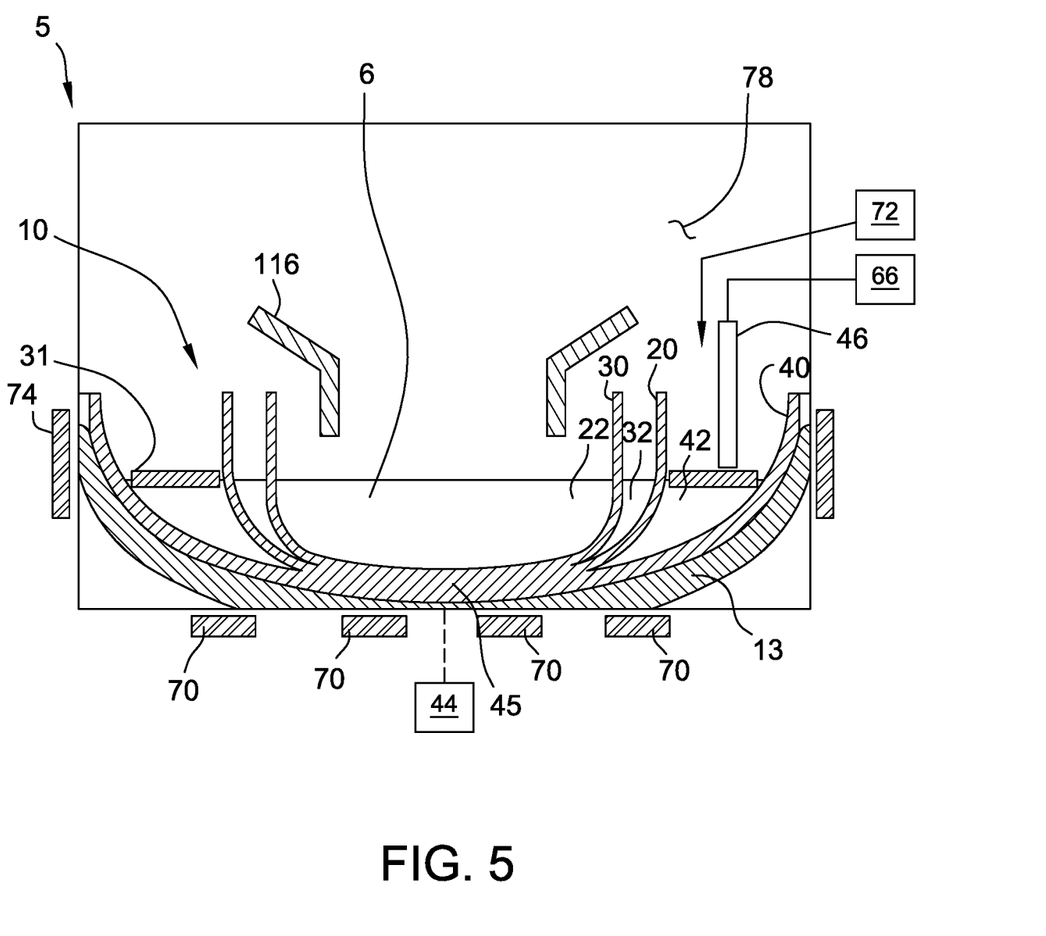
FIG. 5 is a cross-section view of the ingot puller apparatus having a melt with plates floating on the melt.

Referring now to FIG. 4, each plate 31 has one or more openings or slots 49 that extend through the thickness of the plate 31. Once solid-state silicon is discharged through the feeding tube 46 into the outer melt zone 42 of the crucible assembly 10 and onto the one or more plates 31, the silicon melts and falls through the openings 49 and enters the melt 6. In the illustrated embodiment, the openings 49 are slots having a major axis that is generally parallel to the longitudinal axis A of the plate 31 (i.e., the openings 49 are spaced radially) Generally, the openings 49 may have any shape that allows the plates 31 to operate as described herein. Generally, the openings 49 may be sized to be smaller than the size of the type of polysilicon introduced into the outer melt zone (e.g., chunk, chips or granular).

The plates 31 have an inner edge 51 and an outer edge 53. The edges 51, 53 are rounded to match the contours of the outer melt zone 42 (i.e., the area bound by the first weir 20 and sidewall 40). The outer edge 53 is longer than the inner edge 51. First and second sides 57, 59 extend between the inner and outer edges 51, 53.

Each plate 31 has a width $W_{31}$. The width $W_{31}$ of each plate 31 is less than the width $W_{42}$ (FIG. 3) of the outer melt zone 42 to allow the plates 31 to be disposed within the outer melt zone 42 without contacting the first weir 20 or the sidewall 40 (e.g., during meltdown and/or during ingot growth).

Once polycrystalline silicon is added to the crucible assembly 10 to form a charge 27 and the plates 31 have been added to the outer melt zone 42, the charge 27 is heated to a temperature above the melting temperature of silicon (e.g., about 1412° C.) to melt the charge, and thereby form a silicon melt 6 (FIG. 6) comprising molten silicon. The silicon melt 6 has an initial volume of molten silicon and has an initial melt elevation level, and these parameters are determined by the size of the initial charge 27. In some embodiments, the crucible assembly 10 comprising the silicon melt 6 is heated to a temperature of at least about 1425° C., at least about 1450° C. or even at least about 1500° C. One the initial melt 6 is formed, the plates 31 float on the melt 6 in the outer melt zone 42.

The ingot pulling apparatus 5 includes a pulling mechanism 114 (FIG. 6) for growing and pulling the ingot 60 from the melt 6 within the inner melt zone 22. The pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a lifting mechanism (e.g., driven pulley or drum, or any other suitable type of lifting mechanism) and the other end is connected to the chuck 120 that holds the seed crystal 122. In operation, the seed crystal 122 is lowered to contact the melt 6 in the inner melt zone 22. The pulling mechanism 114 is operated to cause the seed crystal 122 to rise along pull axis A. This causes a single crystal ingot 60 to be pulled from the melt 6.

Once the charge 27 (FIG. 1) of polycrystalline silicon is liquefied to form a silicon melt 6 (FIG. 5) comprising molten silicon with the plates 31 floating above the melt 6, the silicon seed crystal 122 (FIG. 6) is lowered to contact the melt 6 within the inner melt zone 22. The silicon seed crystal 122 is then withdrawn from the melt 6 with silicon being attached thereto to form a neck 52 thereby forming a melt-solid interface near or at the surface of the melt 6.

The pulling mechanism 114 may rotate the seed crystal 122 and the ingot 60 connected thereto. A crucible drive unit 44 may rotate the susceptor 13 and crucible assembly 10. In some embodiments, the silicon seed crystal 122 and the crucible assembly 10 are rotated in opposite directions, i.e., counter-rotation. Counter-rotation achieves convection in the silicon melt 6. Rotation of the seed crystal 122 is mainly used to provide a symmetric temperature profile, suppress angular variation of impurities and also to control crystal melt interface shape.

After formation of the neck 52, an outwardly flaring seed-cone portion 54 (or "crown") adjacent the neck 52 is grown. In general, the pull rate is decreased from the neck portion pull rate to a rate suitable for growing the outwardly flaring seed-cone portion 54. Once the seed-cone portion reaches the target diameter, the many body 56 or "constant-diameter portion" of the ingot 60 is grown. In some embodiments, the main body 56 of the ingot 60 has a diameter of about 150 mm, at least about 150 mm, about 200 mm, at least about 200 mm, about 300 mm, at least about 300 mm, about 450 mm, or even at least about 450 mm.

While the ingot 60 is pulled from the melt 6, solid polysilicon feedstock is added to the outer melt zone 42 through the tube 46 or other channel to replenish the melt 6 in the ingot growth apparatus 5. Solid polycrystalline silicon may be added from a polycrystalline silicon feed system 66 and may be continuously or intermittently added to the ingot puller apparatus 5 to maintain the melt level. Generally, polycrystalline silicon may be metered into the ingot puller apparatus 5 by any method available to those of skill in the art. The solid polysilicon added to the outer melt zone 42 may be silicon chips, chunk or granular.

In some embodiments, dopant is also added to the melt 6 during ingot growth. Dopant may be introduced from a dopant feed system 72. Dopant may be added as a gas or solid and may be added to the outer melt zone 42.

The apparatus 5 may include a heat shield 116 disposed about the ingot 60 to permit the growing ingot 60 to radiate its latent heat of solidification and thermal flux from the melt 6. The heat shield 116 may be at least partially conical in shape and angles downwardly at an angle to create an annular opening in which the ingot 60 is disposed. A flow of an inert gas, such as argon, is typically provided along the length of the growing crystal. The ingot 60 is pulled through a growth chamber 78 that is sealed from the surrounding atmosphere.

A plurality of independently controlled annular bottom heaters 70 may be disposed in a radial pattern beneath the crucible assembly 10. Annular bottom heaters 70 apply heat in a relatively controlled distribution across the entire base surface area of the crucible assembly 10. The annular bottom heaters 70 may be planar resistive heating elements that are individually controlled as described in U.S. Pat. No. 7,635,414, which is incorporated herein by reference for all relevant and consistent purposes. The apparatus 5 may include one or more side heaters 74 disposed radially outward to the crucible assembly 10 to control the temperature distribution through melt 6.

The ingot growth apparatus 5 shown in FIGS. 1-6 and described herein is exemplary and generally any system in which a crystal ingot is prepared by a continuous Czochralski method may be used unless stated otherwise.

As the ingot 60 is withdrawn from the melt 6, solid polycrystalline silicon feedstock is added to the crucible assembly 10 while withdrawing the single crystal silicon ingot 60 to replenish the melt 6. Solid-state silicon falls onto the plates 31 which at least partially cover the melt 6 in the outer melt zone 42. The heat of the melt 6 heats the solid polycrystalline silicon disposed on the plates 31 causing the silicon to melt and pass through openings 49 that extend through the plate 31 or fall over the edges 51, 53 and/or sides 57, 59 of the plates 31.

In some continuous Czochralski processes, more than one ingot is grown while the hot zone (i.e., lower portion of the apparatus 5 such as the crucible assembly 10 and the susceptor 13) remains heated with silicon melt 6 being continuously within the crucible assembly 10. In such methods, a first ingot is grown to a target length and growth is terminated, the ingot is removed from the ingot puller, and a seed crystal is then lowered into the melt to initiate growth of a second single crystal silicon ingot (i.e., using the same melt from which the first ingot was withdrawn). The plates 31 remain in the melt 6 while the second and subsequent ingots are grown and while polycrystalline silicon is added to the outer melt zone 42 to replenish the melt. The thickness of the plates 31 may be selected such that the plates 31 do not fully dissolve and remain in the melt 6 after the first ingot is formed. In other embodiments, a new set of plates 31 is added before growth of each subsequent ingot.

Subsequent ingots may be grown with the hot zone intact and at temperature with a continuous melt of silicon being within the crucible assembly 10 (e.g., until one or more components of the hot zone have degraded such as the crucible assembly requiring cool-down and replacement of the degraded component). For example, at least 1, 2, 3, 4, 5, 6, 10, or 20 or more ingots may be grown.

Compared to conventional methods for growing single crystal silicon ingots in a continuous Czochralski (CCz) process, the methods of the present disclosure have several advantages. Without being bound by any particular theory, it is believed that addition of polycrystalline silicon into the outer melt zone of the crucible assembly creates relatively small bubbles (e.g., less than 10 μm) of the inert gas (e.g., argon) that can be carried by the melt through the openings within each weir which allows bubbles to reach the solid-melt interface. The plates may act to prevent entrapment of the inert gas into the melt by preventing polycrystalline feedstock from being discharged directly into the melt. The plates may also provide surface area and nucleation points for inert gas bubbles to aggregate, thereby increasing the size of the bubbles to allow them to become more buoyant. The plates provide a monolithic layer of quartz on the surface of the melt (e.g. with less gaps relative to quartz cullets). The plates dissolve an amount after melt formation and the dissolved quartz also helps remove inert gas from the melt. The rate of dissolution of the plates is less relative to quartz cullets which increases the durability of the plates relative to cullets. The plates may be placed in the crucible assembly relatively easily before the hot zone is up to temperature (e.g., placed on the initial charge of polycrystalline silicon). In embodiments in which a plurality of plates are used, the plates are less rigid and are permitted to move with the silicon as it moves relative to the crucible which helps ensure the plates do not become submerged in the melt. In embodiments in which the plates have a width less than the width of the outer melt zone, the plates are less likely to sinter to the sides/weirs of the crucible assembly during meltdown.

EXAMPLES

The processes of the present disclosure are further illustrated by the following Examples. These Examples should not be viewed in a limiting sense.

Figure 7:
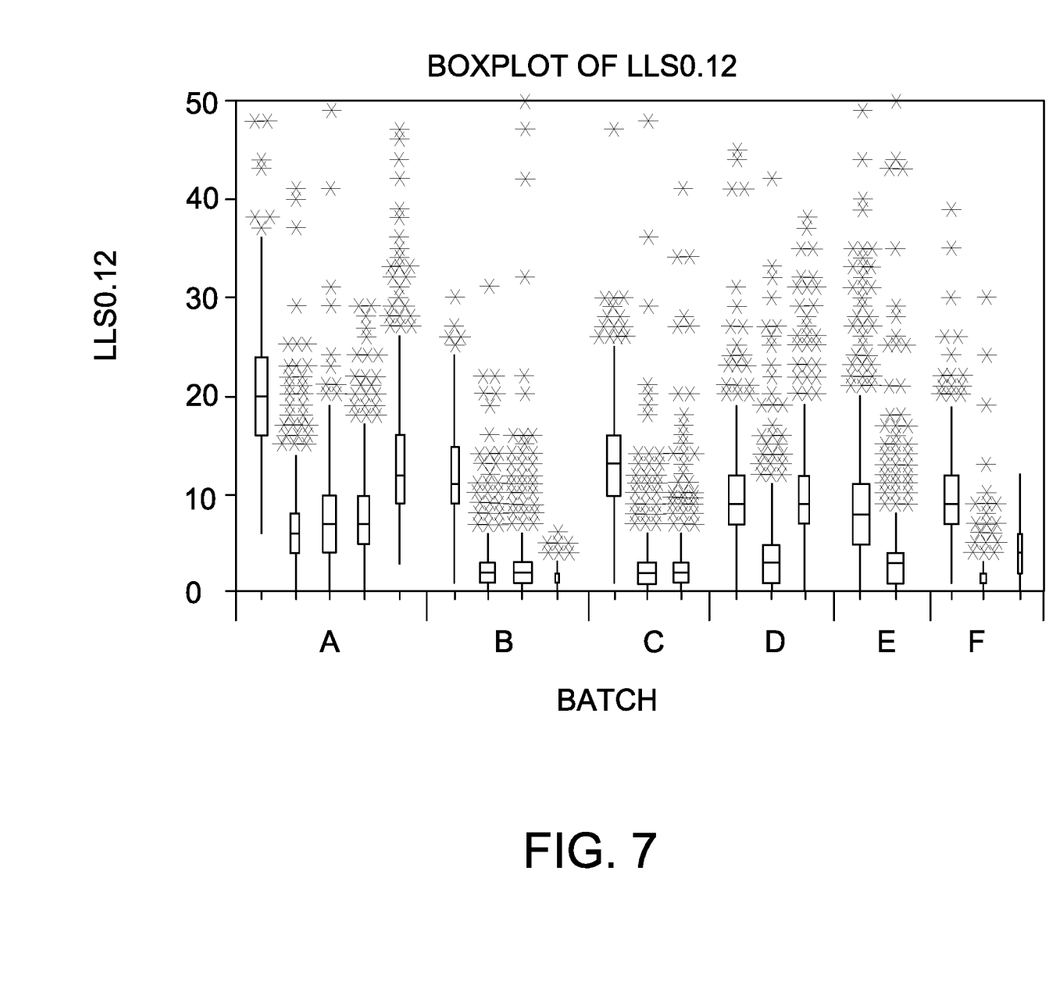
FIG. 7 is a box plot showing void counts in wafers sliced from first ingots (first batch) grown in a continuous Czochralski process.

Example 1: Number of Voids in Wafers Grown from Ingots in which Quartz Plates were Added to the Outer Melt Zone As shown in FIG. 7, the first ingot (Batch A) grown during a continuous Czochralski process (200 mm) typically includes more microvoids (detected by laser light scattering with a size of at least than 0.12 μm) relative to subsequently grown ingots (Ingots B-G).

Figure 8:
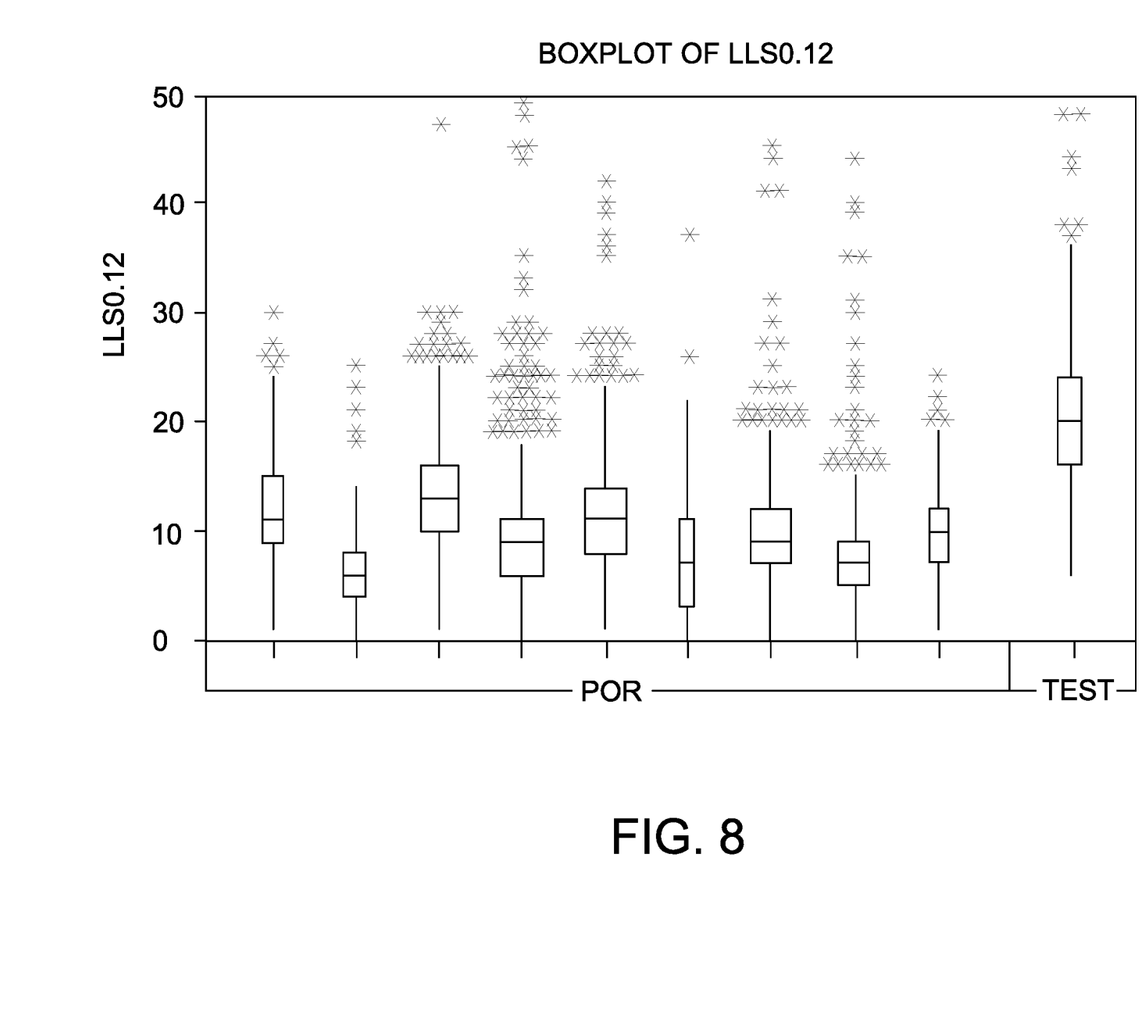
FIG. 8 is a box plot showing void counts in wafers sliced from a first ingot grown in a continuous Czochralski process in which plates covered the melt during addition of solid state silicon to the outer melt zone ("TEST") and in which cullets covered the melt during addition of solid state silicon to the outer melt zone ("POR").

FIG. 8 shows the void count for the first grown ingots (Batch A) during a number of continuous Czochralski runs. The "Test" run (far right box plot) included plates on top of the initial charge of silicon (FIG. 2) and on the subsequent melt (FIG. 6) as polycrystalline silicon was added to the outer melt zone. The other runs included quartz cullets instead of quartz plates. As shown from FIG. 8, the run with plates did not increase void counts to unacceptable levels.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for growing a single crystal silicon ingot in a continuous Czochralski process, the method comprising:
    adding a charge of polycrystalline silicon to a crucible assembly, the crucible assembly comprising a weir and a sidewall that define an outer melt zone between the weir and the sidewall;
    adding one or more plates to the outer melt zone;
    forming a melt of silicon in the crucible assembly, the one or more plates floating on the melt, the one or more plates each including one or more openings that extend therethrough to allow silicon to enter the melt, wherein each of the one or more plates floating on the melt includes one or more openings that extend therethrough to allow silicon to enter the melt;
    contacting a surface of the melt with a seed crystal;
    withdrawing the single crystal silicon ingot from the melt; and
    adding solid polycrystalline silicon feedstock to the outer melt zone while withdrawing the single crystal silicon ingot to replenish the melt, the one or more plates at least partially covering the melt in the outer melt zone while adding solid polycrystalline silicon feedstock to the outer melt zone, silicon entering the melt through the one or more openings that extend through the one or more plates.

2. The method as set forth in claim 1 wherein the weir is a first weir, the crucible assembly comprising a second weir radially inward to the first weir, the first weir and second weir defining a middle melt zone between the first weir and the second weir, the second weir defining an inner melt zone within the second weir.

3. The method as set forth in claim 1 wherein the outer melt zone has a width and each of the one or more plates has a width, the width of each of the one or more plates being less than the width of the outer melt zone.

4. The method as set forth in claim 1 wherein the plates are disposed on solid polycrystalline silicon in the outer melt zone before forming the melt of silicon in the crucible assembly.

5. The method as set forth in claim 1 wherein the one or more plates are made of quartz.

6. The method as set forth in claim 1 wherein the single crystal silicon ingot is a first ingot withdrawn from the melt after the melt of silicon in the crucible assembly is formed.

7. The method as set forth in claim 6 further comprising:
    contacting a surface of the melt with the seed crystal;
    withdrawing a second single crystal silicon ingot from the melt; and
    adding solid polycrystalline silicon feedstock to the outer melt zone while withdrawing the second single crystal silicon ingot to replenish the melt, the one or more plates at least partially covering the melt in the outer melt zone while adding solid polycrystalline silicon feedstock to the outer melt zone.

8. The method as set forth in claim 1 wherein the single crystal silicon ingot is a single crystal silicon ingot grown subsequent to a first single crystal silicon ingot being withdrawn from the melt.

* * * * *